Figure 1:
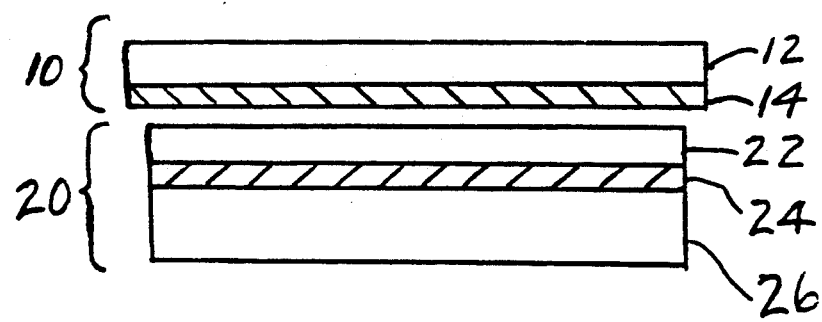

United States Patent [19]
Kaszczuk et al.

[11] Patent Number: 5,278,576
[45] Date of Patent: Jan. 11, 1994

[54] INTERMEDIATE RECEIVER OPAQUE SUPPORT

[75] Inventors: Linda Kaszczuk; Mitchell S. Burberry; Robert G. Spahn, all of Webster; James E. Klijanowicz, Pittsford, all of N.Y.

[73] Assignee: Eastman Kodak Company, Rochester, N.Y.

[21] Appl. No.: 606,404

[22] Filed: Oct. 31, 1990

[51] Int. Cl.⁵ .............. G01D 9/00; G01D 15/16; G03C 8/00; B41M 5/26
[52] U.S. Cl. .................. 346/1.1; 346/135.1; 346/76 L; 503/227; 430/201
[58] Field of Search ........... 346/76 L, 135.1, 108, 1.1; 503/227; 430/201, 213; 427/146

[56] References Cited

U.S. PATENT DOCUMENTS

| | | | |
|---|---|---|---|
| 4,587,198 | 5/1986 | Fisch | 430/201 |
| 4,600,669 | 7/1986 | Ng et al. | 430/47 |
| 4,719,170 | 1/1988 | Schrott et al. | 346/76 L X |
| 4,762,734 | 8/1988 | Duff et al. | 427/146 |
| 4,923,848 | 5/1990 | Akada et al. | 503/227 |
| 4,965,242 | 8/1990 | DeBoer et al. | 430/201 X |

FOREIGN PATENT DOCUMENTS

| | | |
|---|---|---|
| 0169049 | 1/1986 | European Pat. Off. |
| 0404948 | 1/1990 | European Pat. Off. |
| 0032001 | 3/1978 | Japan ............ 346/107 R |
| 2-25386 | 1/1990 | Japan |
| 2-25390 | 1/1990 | Japan |
| 2-25391 | 1/1990 | Japan |
| 2-25392 | 1/1990 | Japan |
| 9000116 | 1/1990 | PCT Int'l Appl. |

*Primary Examiner*—Benjamin R. Fuller
*Assistant Examiner*—David Yockey
*Attorney, Agent, or Firm*—Andrew J. Anderson

[57] ABSTRACT

A thermal dye transfer process, and intermediate receiver used therein, for obtaining a color image which is used to represent a printed color image obtained from a printing press comprising (a) imagewise-heating by means of a laser a dye-donor element in contact with a polymeric dye image-receiving layer of an intermediate dye-receiving element, thereby transferring a dye image to the dye image-receiving layer, the intermediate dye-receiving element comprising the dye image-receiving layer and a layer substantially opaque to light at the wavelength the laser is operated at, (b) adhering the dyed polymeric dye image-receiving layer to a final receiver element, and (c) separating the opaque layer from the dyed image-receiving layer. Preferably, the opaque layer is reflective, and most preferably specularly reflective.

19 Claims, 1 Drawing Sheet

INTERMEDIATE RECEIVER OPAQUE SUPPORT

This invention relates to a thermal dye transfer process and intermediate receiver used therein for obtaining a color proof which is used to represent a printed color image obtained from a printing press, and more particularly to the use of opaque and reflective supports in the intermediate receiver used in the process. For the purpose of this invention, black and white images are considered to fall within the term "color image."

In order to approximate the appearance of continuous-tone (photographic) images via ink-on-paper printing, the commercial printing industry relies on a process known as halftone printing. In halftone printing, color density gradations are produced by printing patterns of dots of various sizes, but of the same color density, instead of varying the color density uniformly as is done in photographic printing.

There is an important commercial need to obtain a color proof image before a printing press run is made. It is desired that the color proof will accurately represent the image quality, details, color tone scale and, in many cases, the halftone pattern of the prints obtained on the printing press. In the sequence of operations necessary to produce an ink-printed, full-color picture, a proof is also required to check the accuracy of the color separation data from which the final three or more printing plates or cylinders are made. Traditionally, such color separation proofs have involved silver halide photographic, high-contrast lithographic systems or non-silver halide light-sensitive systems which require many exposure and processing steps before a final, full-color picture is assembled. U.S. Pat. No. 4,600,669 of Ng et al., for example, discloses an electrophotographic color proofing system.

In U.S. patent application 514,643, U.S. Pat. No. 5,126,760, filed Apr. 25, 1990, of DeBoer, the disclosure of which is incorporated by reference, a thermal dye transfer process is described for producing a direct digital, halftone color proof of an original image. The proof is used to represent a printed color image obtained from a printing press. The process described therein comprises:

a) generating a set of electrical signals which is representative of the shape and color scale of an original image;

b) contacting a dye-donor element comprising a support having thereon a dye layer and an infrared-absorbing material with a first intermediate dye-receiving element comprising a support having thereon a polymeric, dye image-receiving layer;

c) using the signals to imagewise-heat by means of a diode laser the dye-donor element, thereby transferring a dye image to the first dye-receiving element; and d) retransferring the dye image to a second final dye image-receiving element which has the same substrate as the printed color image.

As set forth in Ser. No. 514,643, U.S. Pat. No. 5,126,760 described above, an intermediate dye-receiving element is used with subsequent retransfer to a second receiving element to obtain the final color proof. This is similar to the electrophotographic color proofing system of Ng et al. referred to above, which discloses forming a composite color image on a dielectric support with toners and then laminating the color image and support to a substrate to simulate a color print expected from a press run. In both processes, the second or final receiving element can have the same substrate as that to be used for the actual printing press run. This allows a color proof to be obtained which most closely approximates the look and feel of the printed images that will be obtained in the actual printing press run. A multitude of different substrates can be used to prepare the color proof (the second receiver); however, there needs to be employed only one intermediate receiver.

For thermal dye transfer color proofing, the intermediate receiver can be optimized for efficient dye uptake without dye-smearing or crystallization. In the retransfer step, the dyes and receiver binder may be transferred together to the second receiver, or the dyes alone may be transferred where the second receiver is receptive to the dyes. Preferably, the dyes and receiver binder are transferred together to the final color proof receiver in order to maintain image sharpness and overall quality, which may be lessened when the dyes are retransferred alone to the final receiver. This is similar to the electrophotographic color proofing system of Ng et al. which discloses transferring a separable dielectric polymeric support layer together with the composite toner image from an electrophotographic element to the final receiver substrate.

Since the final receiver provides the desired background for the proof image, the intermediate support need not provide any particular background for viewing. After transfer of the imaged dye-receiving layer of the intermediate dye-receiving element to the final color proof receiver, the intermediate receiver support may be simply discarded. As such, a simple clear support has been used as disclosed in Ser. No. 514,643, U.S. Pat. No. 5,126,760 referred to above for economical purposes.

Where the initial dye transfer to the intermediate receiver is done by laser thermal dye transfer as set forth in Ser. No. 514,643, U.S. Pat. No. 5,126,760, a dye-donor containing an infrared-absorbing material and an intermediate receiver are brought in face to face contact on a surface such as a print drum and a dye image is transferred by imagewise heating the dye-donor with a laser to volatilize the dye, the laser beam being directed at the dye-donor and modulated by a set of signals which is representative of the shape nd color of the original image, so that the dye is heated to cause volatilization only in those areas in which its presence is required on the dye-receiving layer to reconstruct the color of the original image. While the use of a laser to perform the initial dye transfer offers substantial advantages in terms of image sharpness, the system described in Ser. No. 5,14,643, U.S. Pat. No. 5,126,760 has been found to occasionally result in lower density image defects (i.e., images with defect areas having a lower density than surrounding areas). It would be desirable to obtain a color proof by laser thermal dye transfer without generating such defects.

These and other objects are achieved in accordance with the invention which in one embodiment comprises the process steps of (a) imagewise-heating by means of a laser a dye-donor element in contact with a polymeric dye image-receiving layer of an intermediate dye-receiving element, thereby transferring a dye image to the dye image-receiving layer, the intermediate dye-receiving element comprising the dye image-receiving layer and a layer substantially opaque to light at the wavelength the laser is operated at, (b) adhering the dyed polymeric dye image-receiving layer to a final receiver element, and (c) separating the opaque layer from the dyed image-receiving layer.

In a further embodiment, the invention comprises the intermediate receiving element used in the above process.

FIG. 1 represents a cross section of a dye-donor element and an intermediate dye-receiving element according to one embodiment of the invention. In FIG. 1, dye-donor element 10 comprising a support 12 and a dye containing layer 14 is aligned with intermediate dye-receiving element 20 comprising a dye image-receiving layer 22, a separable opaque layer 24, and a support 26.

It has been found that the defects in the formed dye image correspond to irregularities in the print drum surface upon which the intermediate receiver and dye donor are placed during the initial dye transfer. Such defects are believed to result from the laser being non-uniformly reflected back into the dye donor from the drum surface after passing through the dye donor and intermediate receiver due to the irregularities in the drum surface, and thereby non-uniformly re-heating the dye donor. The irregularities may take the form of vacuum holes (used to secure the intermediate receiver uniformly to the drum), scratches, dirt-corrosion, ink or marker lines, etc.

The process of the invention employs an intermediate receiver element having a substantially opaque layer. For the purposes of this invention, a layer is considered to be substantially opaque if it prevents a majority of the laser light used to heat the dye donor from passing through the intermediate receiving element. Such an opaque layer is preferably chosen to have an optical transmission density of at least 1.0, most preferably at least 1.4, at the wavelength of the laser light in order to minimize the fraction of the laser light which passes through the intermediate receiver, thereby minimizing the amount of the laser light which reaches the printing drum surface and any detrimental effect resulting from non-uniformity of reflectance off the printer drum surface.

The opaque layer used in the invention may comprise any material or combination of materials that prevents the majority of light at the wavelength of the laser light from passing through. Metallic layers such as aluminum, silver, nickel, titanium, etc., carbon layers, and pigmented polymeric layers such as titanium dioxide pigmented poly(ethylene terephthalate) or polyethylene have been found to be effective for diode lasers operating in the near infrared region. Many other materials may also be used to form opaque layers, such as metal oxides, sulfides or salts, dyes, other colorants, etc., and selection of equivalent opaque layers is well within the skill of the artisan. The optimal thickness of the opaque layer depends upon the material it is made of. For example, very thin metallic layers (e.g. on the order of 0.01 to 0.2 $\mu$m) provide sufficient optical density to prevent the majority of near infrared diode laser light from passing through, while thicker layers of pigmented polymers may be required to provide the same optical density. Optimization of the opaque layer thickness based upon the specific material used is a matter of routine experimentation and well within the skill of the artisan.

In a preferred embodiment of the invention, an opaque layer is used which is reflective to light at the wavelength of the laser used in the process of the invention. For the purposes of this invention, a layer is considered to be reflective when its total percent reflectance is greater than or equal to about 15% measured at the wavelength of the laser light used to heat the dye donor. Such reflective layers have been found to result in an increase in the dye transfer efficiency to the intermediate receiver compared to non-reflective opaque layers. In a more preferred embodiment, the opaque layer is highly reflective, having a total percent reflectance of greater than or equal to about 50% at the wavelength of the laser light.

In a further preferred embodiment, the opaque layer is primarily specularly reflective to light at the wavelength of the laser. A layer is considered to be primarily specularly reflective when it specularly reflects a greater percentage of light than it diffusely reflects. Vacuum deposited layers of metals such as chromium, copper, titanium, aluminum, silver, etc. and of carbon are examples of primarily specularly reflective materials.

The intermediate dye-receiving element may include a separate support bearing the opaque layer, or the opaque layer itself may function as the element support. Where a separate support is used, it may be a polymeric film such as a poly(ether sulfone), a polyimide, a cellulose ester such as cellulose acetate, a poly(vinyl alcohol-co-acetal) or a poly(ethylene terephthalate). In general, polymeric film supports of from 5 to 500 $\mu$m are used. Alternatively, a paper support may be used. Where a paper support is used, it is preferably resin coated to provide smoothness. The intermediate support thickness is not critical, but should provide adequate dimensional stability. Self-supporting opaque and/or reflective layers may take the form of films, foils, sheets, etc. In addition to their use in intermediate receiving elements, separable opaque and/or reflective layers may also be used to mask defects and increase dye density transfer to receiving elements used to form transparencies.

Where a separate support is used, the opaque layer may be applied by any conventional means such as solvent coating, vapor deposition, chemical vapor deposition, vacuum deposition, extrusion coating, lamination, etc. The opaque layer may be applied to the same side of the support the dye image-receiving layer is to be applied to, or may be applied on the opposite side of the support. Preferably, when the opaque layer is also reflective, it is on the same side of the support as the dye image-receiving layer. This places the reflective layer closer to the dye donor, and thereby maximizes dye transfer efficiency due to the laser being uniformly reflected back into the dye donor.

The dye image-receiving layer may comprise, for example, a polycarbonate, a polyurethane, a polyester, polyvinyl chloride, cellulose esters such as cellulose acetate butyrate or cellulose acetate propionate, poly (styrene-co-acrylonitrile), poly(caprolactone), polyvinyl acetals such as poly(vinyl alcohol-co-butyral), mixtures thereof, or any other conventional polymeric dye-receiver material provided it will adhere to the second receiver. The dye image-receiving layer may be present in any amount which is effective for the intended purpose. In general, good results have been obtained at a concentration of from about 0.2 to about 5 g/m$^2$.

The dye-donor that is used in the process of the invention comprises a support having thereon a heat transferable dye-containing layer. The use of dyes in the dye-donor permits a wide selection of hue and color that enables a close match to a variety of printing inks and also permits easy transfer of images one or more times to a receiver if desired. The use of dyes also allows easy modification of density to any desired level.

Any dye can be used in the dye-donor employed in the invention provided it is transferable to the dye-receiving layer by the action of the heat. Especially good results have been obtained with sublimable dyes such as anthraquinone dyes, e.g., Sumikalon Violet RS ® (product of Sumitomo Chemical Co., Ltd.), Dianix Fast Violet 3R-FS ® (product of Mitsubishi Chemical Industries, Ltd.), and Kayalon Polyol Brilliant Blue N-BGM ® and KST Black 146 ® (products of Nippon Kayaku Co., Ltd.); azo dyes such as Kayalon Polyol Brilliant Blue BM ®, Kayalon Polyol Dark Blue 2BM ®, and KST Black KR ® (products of Nippon Kayaku Co., Ltd.), Sumickaron Diazo Black 5G ® (product of Sumitomo Chemical Co., Ltd.), and Miktazol Black 5GH ® (product of Mitsui Toatsu Chemicals, Inc.); direct dyes such as Direct Dark Green B ® (product of Mitsubishi Chemical Industries, Ltd.) and Direct Brown M ® and Direct Fast Black D ® (products of Nippon Kayaku Co. Ltd.); acid dyes such as Kayanol Milling Cyanine 5R ® (product of Nippon Kayaku Co. Ltd.); basic dyes such as Sumicacryl Blue 6G ® (product of Sumitomo Chemical Co., Ltd.), and Aizen Malachite Green ® (product of Hodogaya Chemical Co., Ltd.); or any of the dyes disclosed in U.S. Pat. Nos. 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology., Proceedings of the 19th International Conference of Printing Research Institutes, Eisenstadt, Austria, June 1987, J. T. Ling and R. Warner, p. 55. Preferred dyes and dye combinations found to best match the SWOP Color References are the subject matter of copending, commonly assigned U.S. Ser. Nos. 07/606,398, U.S. Pat. No. 5,023,229, 07/606399, abandoned, and 07/606,395, U.S. Pat. No. 5,024,990 of Chapmann and Evans, the disclosures of which are incorporated by reference.

The dyes of the dye-donor element employed in the invention may be used at a coverage of from about 0.05 to about 1 g/m$^2$, and are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate; poly(styrene-co-acrylonitrile); a poly(sulfone); a poly(vinyl alcohol-co-acetal) such as poly(vinyl alcohol-co-butyral) or a poly(phenylene oxide). The binder may be used at a coverage of from about 0.1 to about 5 g/m$^2$.

The dye layer of the dye-donor element may be coated on the support or printed thereon by a printing technique such as a gravure process.

Any material can be used as the support for the dye-donor element employed in the invention provided it is dimensionally stable and can withstand the heat needed to transfer the sublimable dyes. Such materials include polyesters such as poly(ethylene terephthalate); polyamides; polycarbonates; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylpentane polymers; and polyimides such as polyimide-amides and polyetherimides. The support generally has a thickness of from about 5 to about 200 μm. It may also be coated with a subbing layer, if desired, such as those materials described in U.S. Pat. Nos. 4,695,288 or 4,737,486.

It is preferred to use a diode laser to transfer dye from the dye donor to the intermediate receiver since it offers substantial advantages in terms of its small size, low cost, stability, reliability, ruggedness, and ease of modulation. In practice, before any laser can be used to heat a dye-donor element, the element must contain an infrared-absorbing material. The laser radiation is then absorbed into the dye layer and converted to heat by a molecular process known as internal conversion.

Lasers which can be used to transfer dye from dye-donors employed in the invention are available commercially. There can be employed, for example, Laser Model SDL-2420-H2 from Spectro Diode Labs, or Laser Model SLD 304 V/W from Sony Corp.

In the above process, multiple dye-donors may be used in combination to obtain as many colors as desired in the final image. For example, for a full-color image, four colors: cyan, magenta, yellow and black are normally used.

Thus, in a preferred embodiment of the process of the invention, a dye image is transferred by imagewise heating a dye-donor containing an infrared-absorbing material with a diode laser to volatilize the dye, the diode laser beam being modulated by a set of signals which is representative of the shape and color of the original image, so that the dye is heated to cause volatilization only in those areas in which its presence is required on the dye-receiving layer to reconstruct the color of the original image.

Spacer beads may be employed in a separate layer over the dye layer of the dye-donor in the above-described laser process in order to separate the dye-donor from the dye-receiver during dye transfer, thereby increasing its uniformity and density. That invention is more fully described in U.S. Pat. No. 4,772,582, the disclosure of which is hereby incorporated by reference. Alternatively, the spacer beads may be employed in or on the receiving layer of the dye-receiver as described in U.S. Pat. No. 4,876,235, the disclosure of which is hereby incorporated by reference. The spacer beads may be coated with a polymeric binder if desired.

In a further preferred embodiment of the invention, an infrared-absorbing dye is employed in the dye-donor element instead of carbon black in order to avoid desaturated colors of the imaged dyes from carbon contamination. The use of an absorbing dye also avoids problems of non-uniformity due to inadequate carbon dispersing. For example, cyanine infrared absorbing dyes may be employed as described in DeBoer Application Ser. No. 463,095, U.S. Pat. No. 4,973,572 filed Jan. 10, 1990, the disclosure of which is hereby incorporated by reference. Other materials which can be employed are described in the following 07/ series, in U.S. application Ser. Nos.: 366,970, U.S. Pat. No. 4,998,779, 367,062, U.S. Pat. No. 5,035,977, 366,967, U.S. Pat. No. 4,950,640, 366,968, U.S. Pat. No. 4,950,639, 366,969, U.S. Pat. No. 4,948,776, 367,064, U.S. Pat. No. 5,019,480, 367,061, U.S. Pat. No. 5,034,303, 369,494, U.S. Pat. No. 4,948,778, 366,952, U.S. Pat. No. 4,948,141, 369,493, abandoned, 369,492, abandoned and 369,491, U.S. Pat. No. 4,912,083.

A thermal printer which uses the laser described above to form an image on a thermal print medium is described and claimed in copending U.S. Ser. No. 451,656, U.S. Pat. No. 5,168,228 of Baek and DeBoer, filed Dec. 18, 1989, the disclosure of which is hereby incorporated by reference.

As noted above, a set of electrical signals is generated which is representative of the shape and color of an original image. This can be done, for example, by scanning an original image, filtering the image to separate it into the desired basic colors (red, blue and green), and then converting the light energy into electrical energy. The electrical signals are then modified by computer to form the color separation data which is used to form a color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

The dye-donor element employed in the invention may be used in sheet form or in a continuous roll or ribbon. If a continuous roll or ribbon is employed, it may have alternating areas of different dyes or dye mixtures, such as sublimable cyan and/or yellow and/or magenta and/or black or other dyes. Such dyes, for example, are disclosed in the co-pending applications referred to above.

As noted above, after the dye image is obtained on a first intermediate dye-receiving element, it is retransferred to a second or final receiving element in order to obtain a final color image. For color proofs, the final receiving element comprises a paper substrate. The substrate thickness is not critical and may be chosen to best approximate the prints to be obtained in the actual printing press run. Examples of substrates which may be used for the final receiving element (color proof) include the following: Adproof ® (Appleton Paper), Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Consolith Gloss ® (Consolidated Papers Co.) and Mountie Matte ® (Potlatch Inc.).

A dye migration barrier layer, such as a polymeric layer, may be applied to the final receiver color proof paper substrate before the dyed image- o receiving layer is laminated thereto. Such barrier layers help minimize any dye smear which may otherwise occur and are the subject matter of copending, commonly assigned U.S. Ser. No. 07/606,408, U.S. Pat. No. 5,053,381 of Chapman et al, the disclosure of which is incorporated by reference.

The imaged, intermediate dye image-receiving layer may be transferred to the final receiver (color proof substrate), for example, by passing the intermediate and final receiver elements between two heated rollers, use of a heated platen, use of a resistive thermal head, use of other forms of pressure and/or heat, external heating, etc., to form a laminate with the imaged intermediate dye image-receiving layer adhered to the final receiver. The opaque layer and separate intermediate support, if present, are separated from the dye-image receiving layer after they are laminated to the paper substrate. Release agents or stripping layers such as hydroxyethyl cellulose and silicone based materials such as polysiloxanes may be included between the opaque layer and dye image-receiving layer to facilitate separation. Also, stripping layers comprising mixtures of hydrophilic cellulosic material and polyethyleneglycol have been found to enable hot stripping of metal layers from polymeric dye image-receiving layers as disclosed in copending, commonly assigned U.S. Ser. No. 07/606,400, U.S. Pat. No. 5,077,263 (Eastman Kodak Docket No. 60,249) of Henzel, the disclosure of which is incorporated by reference.

The following examples are provided to illustrate the invention.

EXAMPLE 1

Individual magenta dye-donor elements were prepared by coating on a 100 μm poly(ethylene terephthalate) support a dye-layer consisting of a mixture of the magenta dye (0.40 g/m$^2$), yellow dye (0.044 g/m$^2$), and cyanine infrared absorbing dye (0.054 g/m$^2$) illustrated below in a cellulose acetate propionate binder (2.5% acetyl, 45% propionyl)(0.27 g/m$^2$) coated from a dichloromethane and 1,1,2-trichloroethane solvent mixture.

Magenta Dye:

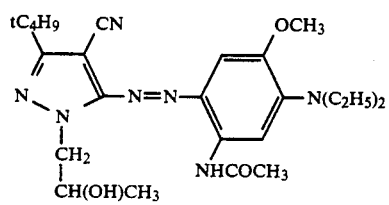

Yellow Dye:

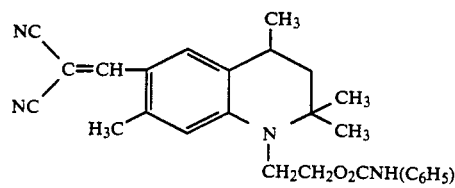

IR Absorbing Dye:

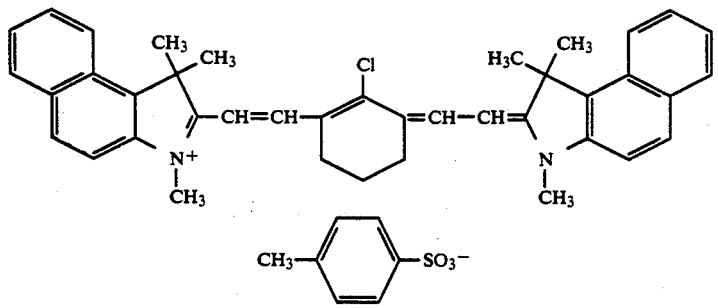

Opacified supports for intermediate dye-receiving elements were prepared as follows:

A. A layer of Regal ® 300 carbon (Regal Carbon Co) (0.05 g/m²) (20-30 micron average diameter), Fluorad ® FC-431 fluorinated surfactant (3M Corp) (0.002 g/m²) and Solsperse ® 24000 dispersing agent (ICI Corp)(0.0005 g/m²) dispersed in cellulose acetate propionate (0.26 g/m²) was coated from a dichloromethane and 1,1,2-trichloroethylene solvent mixture on a 100 μm thick poly(ethylene terephthalate) support. This opacified support had a measured transmission density of 1.8.

B. A layer of metallic aluminum was vacuum deposited using an aluminum source to a coverage of 0.180 μm on a poly(ethylene terephthalate) support (100 μm thick) achieving a measured transmission density of 4.2. Vacuum deposition was done using standard electron beam vapor deposition described by Maisel and Glang, ed., "Handbook of Thin Film Technology," Mc-Graw-Hill Publ. Co, 1983.

C. A layer of metallic aluminum was vacuum deposited as in B above but with a thickness of 0.081 μm achieving a measured transmission density of 3.8.

D. A layer of metallic aluminum was vacuum deposited as in B above but with a thickness of 0.028 μm achieving a measured transmission density of 1.4.

On top of the opaque layer of each opacified support, a release layer of Syloff 7146 ® reactive siloxane polymer (Dow Corning Co.)(0.22 g/m²) and Syloff 7048 ® low molecular weight reactive polysiloxane cross-linking agent (Dow Corning Co.)(0.001 g/m²) was coated from toluene. On top of this layer, a dye-receiving layer of crosslinked poly(styrene-co-divinyl benzene) beads (14 micron average diameter) (0.11 g/m²) and DC-510 ® Silicone Fluid (Dow Corning Co.) (0.03 g/m²) in a Butvar ® B-76 poly(vinyl alcohol-co-butyral) binder (Monsanto Co.)(4.0 g/m²) was coated from 1-butanol.

A control intermediate receiver was prepared with the release and dye-receiving layers as described above but with a transparent poly(ethylene terephthalate) support (Control C-1).

The transmission density of each of the intermediate receivers was read using a Perkin-Elmer Lambda 6 Spectrophotometer at 830 nm.

For printing "defect images" simulating defects resulting from such problems as vacuum holes in and scratches on a reflective printing drum, a defect area consisting of matte black carbon (Kodak Conductive Lacquer CE-035) was created on a printing drum.

Single color half-tone "non-defect" and "defect images were printed as described below onto each intermediate receiver, the images corresponding to the unaltered and "defect" areas of the printing drum. A laser imaging device as described in U.S. Pat. No. 4,876,235 was used consisting of a series of diode lasers connected to a lens assembly mounted on a translation stage and focused onto the dye-donor layers.

The dye-receiving element was secured to the drum of the diode laser imaging device with the receiving layer facing out. The dye-donor element was secured in face-to-face contact with the receiving element.

The diode lasers used were Spectra Diode Labs No. SDL-2430, each having an integral, attached optical fiber for the output of the laser beam with a wavelength range 800-830 nm and a nominal power output of 250 milliwatts at the end of the optical fiber. The cleaved face of the optical fiber (100 microns core diameter) was imaged onto the plane of the dye-donor with a 0.5 magnification lens assembly mounted on a translation stage giving a nominal spot size of 23 microns and a measured total power at the focal plane of 171 milliwatts.

The drum, 298 mm in circumference, was rotated at 200 rpm and the imaging electronics were activated. The translation stage was incrementally advanced across the dye-donor by means of a lead screw turned by a microstepping motor, to give a center-to-center line distance of 14 microns (714 lines per centimeter, or 1800 lines per inch). For a half-tone image, a series of uniform dot patterns of varying size (tints) from 98% tint (high density) to 2% tint (low density) was generated in 10% increments.

After the laser had scanned approximately 50 mm, the laser exposing device was stopped and the intermediate receiver was separated from the dye donor. The intermediate receiver containing a half-tone dye image of varying tints was laminated to Quintessence Gloss ® (Potlatch Co.) 80 pound stock paper by passage through a pair of rubber rollers heated to 120° C. The polyethylene terephthalate support was then peeled away leaving the dye image and poly(vinyl alcohol-co-butyral) firmly adhered to the paper. The paper stock was chosen to represent the substrate used for a printed ink image obtained from a printing press.

The Status A Green reflection density of a 50% tint of the unaltered and defect test areas on the final paper stock receivers were read with a large aperture densitometer (the densitometer reads the average density over an approximately 700 dot area including light and dark parts to give an integrated image density). The difference in these two densities was calculated. Ideally if the defects have no effect upon printing this density difference will be zero. The following results were obtained (TABLE I):

TABLE I

| Intermediate Receiver Support | Transmission Density | Status A Green Reflection Density* | | |
|---|---|---|---|---|
| | | Non-Defect Area | Defect Area | Difference |
| A | 1.8 | 1.43 | 1.42 | 0.01 |
| B | 4.2 | 1.83 | 1.82 | 0.01 |
| C | 3.8 | 1.48 | 1.45 | 0.03 |
| D | 1.4 | 1.49 | 1.47 | 0.02 |
| C-1 | 0.05 | 1.48 | 1.35 | 0.13 |

*Samples A, B, C, and D were read at approximately 50% tint, the control C-1 was read using the closest comparable step at approximately 60% tint. This may affect the absolute density read but has little effect on the difference in density.

The above data show that the intermediate receivers with a substantially opaque layer as indicated by their optical transmission densities minimized the effect of drum defects upon printing.

EXAMPLE 2

Individual cyan dye-donor elements were prepared by coating on a 100 μm poly (ethylene terephthalate) support:

1. a subbing layer of poly(acrylonitrile-co-vinylidene chloride-co-acrylic acid) (14:79:7 wt. ratio)(0.05 g/m²); and
2. a dye-layer containing a mixture of the cyan dyes (0.09 and 0.38 g/m² respectively) illustrated below and infrared absorbing dye (0.054 g/m²) illustrated in Example 1 above in a cellulose acetate propionate binder (2.5% acetyl, 45% propionyl) (0.32 g/m²) coated from a dichloromethane and 1,1,2-trichloroethane solvent mixture.

Cyan Dye (minor component):

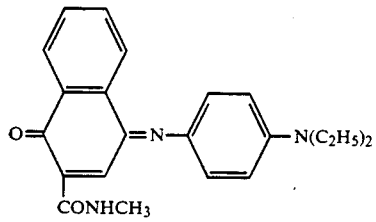

Cyan Dye (major component):

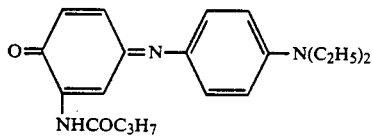

Opacified supports for intermediate dye-receiving elements were prepared as follows:

E. A poly(ethylene terephthalate) support (175 μm thick) containing dispersed titanium dioxide (19 g/m²) was extrusion coated. This support also had a subbing layer of poly(acrylonitrile-co-vinylidene chloride-co-acrylic acid) (14:79:6 wt ratio)(0.05 g/m²). The measured transmission density of the coated support was 4.0.

F. A layer of metallic silver was vacuum deposited using a silver source to provide a coverage of 0.15 μm on a poly(ethylene terephthalate) support (175 μm thick) achieving a measured transmission density of 3.1.

On top of the opacified support or opaque layer on top of the support a release layer and receiver layer were coated as described in Example 1 except butanone was used as a coating solvent.

A control intermediate receiver was prepared as in Example 1 with the release and dye-receiving layers as described above and transparent poly(ethylene terephthalate) support C-1.

The transmission density of each of the intermediate receivers was read using a Perkin-Elmer Lambda 6 Spectrophotometer at 830 nm.

"Defect" areas were created on a printing drum as described in Example 1, and single color images corresponding to the unaltered and "defect" areas were printed as in Example 1 except the images were continuous-tone.

The diode lasers used were Spectra Diode Labs SDL-2430, each having an integral, attached optical fiber for the output of the laser beam with a wavelength of range 800-830 nm and a nominal power output of 250 milliwatts at the end of the optical fiber. The cleaved face of the optical fiber (100 microns core diameter) was imaged onto the plane of the dye-donor with a 0.33 magnification lens assembly mounted on a translation stage giving a nominal spot size of 25.5 microns and a measured total power at the focal plane of 148 milliwatts.

The drum, 412 mm in circumference, was rotated at 400 rpm and the imaging electronics were activated. The translation stage was incrementally advanced across the dye-donor by means of a lead screw turned by a microstepping motor, to give a center-to-center line distance of 14 microns (714 lines per centimeter, or 1800 lines per inch). For a continuous-tone high-density image there was no modulation of the current supplied to the laser.

After the laser had scanned approximately 100 mm, the laser exposing device was stopped and the intermediate receiver was separated from the dye donor. The intermediate receiver containing the dye image was laminated to Quintessence Gloss ® (Potlatch Co.) 80 pound stock paper by passage through a pair of rubber rollers heated to 120° C. The intermediate receiver support was then peeled away leaving the dye image and poly(vinyl alcohol-co-butyral) firmly adhered to the paper.

The Status A Red reflection density of the unaltered and defect areas on each of the final paper stock receivers were read and the difference in density calculated. Ideally if the defects have no effect upon printing this density difference will be zero. The following results were obtained (TABLE II):

TABLE II

| Intermediate Receiver Support | Transmission Density | Status A Red Reflection Density (D max image) | | |
|---|---|---|---|---|
| | | Non-Defect Area | Defect Area | Difference |
| E | 4.0 | 1.49 | 1.46 | 0.03 |
| F | 3.1 | 1.97 | 1.94 | 0.03 |
| C-1 | 0.05 | 1.22 | 1.05–1.16 (variable) | 0.06–0.17 |

The above data show that use of an opaque or high-transmission density receiver of a variety of materials minimizes the effect of drum defects upon printing.

EXAMPLE 3

Individual magenta dye-donor elements were prepared as described in Example 1.

Reflective supports for intermediate dye-receiving elements were prepared as follows:

G. A layer of metallic chromium was vacuum deposited using a chromium source to a coverage of 0.028 μm on a Kapton ® 200H (DuPont Co.) polyimide support (50 μm thick). On top of this chromium layer, a a copper source to a coverage of 0.30 μm. This coated support had a transmission density of greater than 6.0. Vacuum deposition was done using standard d.c.-sputter deposition techniques described in "Handbook of Thin-Film Technology", Maisel and Glang, ed. McGraw-Hill Publ. Co, 1983.

H. Layers of metallic chromium and copper were vacuum deposited as described in G on the opposite side of the support described in G. This side of the support had a rougher surface. This coated support had a transmission density of greater than 6.0.

I. A layer of metallic aluminum was vacuum deposited using an aluminum source to a coverage of 0.081 μm on a poly(ethylene terephthalate) support (100 μm thick). This coated support had a transmission density of 4.2.

J. A layer of metallic titanium was vacuum deposited using a titanium source to a coverage of 0.17 μm on a poly(ethylene terephthalate) support (100 μm thick). This coated support had a transmission density of 4.0.

K. A layer of carbon was vacuum deposited using a carbon source to a coverage of 0.13 μm on a poly(ethylene terephthalate) support (100 μm thick). This coated support had a transmission density of 2.3.

L. A poly(ethylene terephthalate) support (175 μm thick) containing dispersed titanium dioxide 19 g/m$^2$ was extrusion coated. This support also had a subbing layer of poly(acrylonitrile-co-vinylidene chloride-co-acrylic acid) (14:79:7 wt. ratio) (0.05 g/m$^2$). The measured transmission density of the coated support was 4.0.

On top of the reflective layer of each support described above, release and dye-receiving layers were coated as in Example 1.

Comparison intermediate receivers were prepared with the same release and dye-receiving layers, but the supports were transparent poly(ethylene terephthalate) support C-1 and matte black carbon coated support A of Example 1.

The transmission density of each of the intermediate receivers was read at 830 nm using a Perkin-Elmer Lambda 6 Spectrophotometer.

The total and diffuse percent reflectance of the coated reflective support were measured at 830 nm at normal incidence using a Sargent-Welch Pye-Unicam Model PV-8800 Spectrophotometer equipped with a Pye-Unicam Diffuse Reflection Accessory Kit. The equipment was calibrated using a Halon Disk (National Bureau of Standards #Y144-39-16). Percent specular reflectance was calculated as the difference between the measured percent total reflectance and the measured percent diffuse reflectance.

Single color half-tone images were printed from the dye donor onto each intermediate receiver or comparison receiver using a laser imaging device as described in Example 1 to obtain a series of uniform dot patterns of varying size (tints) from 98% tint (high density) to 2% tint (low density) in 10% increments.

The intermediate receiver containing a half-tone dye image of varying tints was laminated to Quintessence Gloss ® (Potlatch Co.) 80 pound stock paper, and the polyethylene terephthalate support was then peeled away leaving the dye image and poly(vinyl alcohol-cobutyral) firmly adhered to the paper as described in Example 1.

The Status A Green reflection density of the maximum density (98% tint) area was read with a large aperture densitometer (the densitometer reads the average density over an approximately 700 dot area including light and dark parts to give an integrated image density). The following results were obtained (TABLE III):

TABLE III

| Intermediate Receiver Support | Percent Reflectance | | | Status A Green Density |
|---|---|---|---|---|
| | Total | Diffuse | Specular | |
| G | 95.4 | 0.6 | 94.8 | 2.2 |
| H | 89.3 | 2.9 | 86.4 | 2.1 |
| I | 80.1 | 0.9 | 79.2 | 2.2 |
| J | 51.5 | 0.7 | 50.8 | 2.1 |
| K | 16.5 | 0.5 | 16.0 | 1.6 |
| L | 84.0 | 81.1 | 2.9 | 1.5 |
| C-1 | <10 | ~0 | <10 | 1.4 |
| A | 6.3 | 5.0 | 1.3 | 0.8 |

Note: Control C-1 should not be considered an "absolute control" because the support is transparent and the density values obtained are dependent on the reflectivity of the drum itself. The drum used in these experiments should be considered of moderate reflectivity.

The data obtained above show that the use of reflective opaque layers increase the transferred image dye-density compared to non-reflective layers when performing laser thermal dye-transfer. The correlation with density increase is most direct with specular percent reflectance.

EXAMPLE 4

Individual cyan dye-donor elements were prepared as described in Example 2.

Reflective supports for intermediate dye-receiving elements were prepared as follows:

M. A layer of metallic silver was vacuum deposited using a silver source to provide a coverage of 0.10 μm on the polyester support (175 μm thick) achieving a measured optical density of 3.1.

N. A layer of metallic silver was vacuum deposited as for G above but the coverage was 0.18 μm and the measured optical density was 5.0.

Intermediate supports I and L of Example 3 were also used.

On top of the reflective support a release layer and receiver layer were coated as described in Example 1 except butanone was used as a coating solvent.

A comparison intermediate receiver was prepared with the same release and dye-receiving layers and a transparent poly(ethylene terephthalate) support C-1.

The transmission density of each of the intermediate receivers was read as in Example 3. The total percent reflectance was measured as described in Example 3.

Single color continuous tone images were obtained similarly as in Example 2, but for a continuous tone stepped image the current supplied to the laser was modulated from full power to 45% power in 4% increments.

After the laser had scanned approximately 150 mm, the laser exposing device was stopped and the intermediate receiver was separated from the dye donor. The intermediate receiver containing a stepped dye image was laminated to Quintessence Gloss ® (Potlatch Co.) 80 pound stock paper, and the intermediate receiver support was then peeled away leaving the dye image and poly(vinyl alcohol-co-butyral) firmly adhered to the paper as in Example 2.

The Status A Red reflection density of the maximum density area of each imaged receiver was read. The following results were obtained (TABLE IV):

TABLE IV

| Intermediate Receiver Support | Total Percent Reflectance | Image Status A Red Density |
| --- | --- | --- |
| I | 80.1 | 1.8 |
| L | 84.0 | 1.5 |
| M | 99.3 | 1.8 |
| N | 99.5 | 1.8 |
| C-1 | <10. | 1.1 |

Note: Control C-1 should not be considered an "absolute control" because the support is transparent and the density values obtained are dependent on the reflectivity of the drum itself. The drum used in these experiments should be considered of moderate reflectivity.

The data tabulated above show that these materials of high total percent reflectance used as the receiver support for laser thermal dye-transfer give a significant increase in transferred image dye-density.

The invention has been described in detail with particular reference to preferred embodiments thereof, but it will be understood that variations and modifications can be effected within the spirit and scope of the invention.

What is claimed is:

1. A dye-receiving element for use in a laser thermal dye transfer process comprising a polymeric dye image-receiving layer, a reflective layer, separable from the dye image-receiving layer, and a support, said reflective layer being substantially opaque to and reflecting about 15% or more of light in an 800 to 830 nm wavelength range.

2. The element of claim 1 wherein the reflective layer comprises a metallic layer deposited on the support.

3. The element of claim 1 wherein the reflective layer is between the support and the dye image-receiving layer.

4. The element of claim 3 wherein the reflective layer is metallic.

5. The element of claim 3 wherein the reflective layer is primarily specularly reflective.

6. The element of claim 1 wherein the reflective layer is metallic.

7. The element of claim 1 wherein the reflective layer is primarily specularly reflective.

8. A process for forming a color image comprising the steps of:
   (a) imagewise-heating by means of a laser operated at a wavelength of light a dye-donor element in contact with a polymeric dye image-receiving layer of an intermediate dye-receiving element, thereby transferring a dye-image to the dye image-receiving layer, said intermediate dye-receiving element comprising the polymeric dye image-receiving layer, a layer substantially opaque to light at the wavelength at which the laser is operated, and a support,
   (b) adhering the dyed polymeric dye image-receiving layer to a final receiver element, and
   (c) separating the opaque layer from the dyed image-receiving layer.

9. The process of claim 8 wherein the laser is a diode laser and step (a) comprises:
   (i) generating a set of electrical signals which is representative of the shape and color scale of an original image,
   (ii) contacting the dye-donor element with the polymeric dye image-receiving layer of the intermediate dye-receiving element, wherein the dye-donor element comprises a support having thereon a dye layer and an infrared-absorbing material, and
   (iii) using the signals to imagewise-heat with the diode laser the dye-donor element, thereby transferring a dye image to the intermediate dye image-receiving layer.

10. The process of claim 9, wherein the diode laser is operated in a wavelength range of from about 800 to 830 nm.

11. The process of claim 10 wherein the opaque layer has a transmission density of at least about 1.0 measured at 830 nm.

12. The process of claim 11 wherein the opaque layer reflects about 15% or more of light in the an 800 to 830 nm wavelength range.

13. The process of claim 12 wherein the opaque layer is metallic.

14. The process of claim 12 wherein the opaque layer is primarily specularly reflective.

15. The process of claim 8 wherein the opaque layer has a transmission density of at least about 1.0 measured at the wavelength of light at which the laser is operated.

16. The process of claim 8 wherein the opaque layer reflects about 15% or more of light at the wavelength at which the laser is operated.

17. The process of claim 16 wherein the opaque layer is metallic.

18. The process of claim 16 wherein the opaque layer is primarily specularly reflective.

19. The process of claim 8, wherein the final receiver element comprises a paper substrate.

* * * * *